(12) United States Patent
Yoffe et al.

(10) Patent No.: US 10,868,561 B2
(45) Date of Patent: Dec. 15, 2020

(54) DIGITAL RESOLUTION ENHANCEMENT FOR HIGH SPEED DIGITAL-TO-ANALOG CONVERTERS

(71) Applicant: B. G. NEGEV TECHNOLOGIES AND APPLICATIONS LTD., Beer-Sheva (IL)

(72) Inventors: Yaron Yoffe, Rishon Lezion (IL); Dan Sadot, Kfar Bilu (IL)

(73) Assignee: B.G. NEGEV TECHNOLOGIES AND APPLICATIONS LTD., AT BEN-GURION UNIVERSITY

( * ) Notice: Subject to any disclaimer, the term of this patent is extended or adjusted under 35 U.S.C. 154(b) by 0 days.

(21) Appl. No.: 16/759,881

(22) PCT Filed: Nov. 1, 2018

(86) PCT No.: PCT/IL2018/051164
§ 371 (c)(1),
(2) Date: Apr. 28, 2020

(87) PCT Pub. No.: WO2019/087190
PCT Pub. Date: May 9, 2019

(65) Prior Publication Data
US 2020/0287560 A1 Sep. 10, 2020

Related U.S. Application Data

(60) Provisional application No. 62/580,475, filed on Nov. 2, 2017.

(51) Int. Cl.
*H03M 1/66* (2006.01)
*H03M 1/06* (2006.01)
*H04B 1/04* (2006.01)

(52) U.S. Cl.
CPC ......... *H03M 1/661* (2013.01); *H03M 1/0626* (2013.01); *H04B 1/0475* (2013.01)

(58) Field of Classification Search
CPC .. H03M 1/661; H03M 1/0626; H04B 1/0475; H04B 2001/0425; H04B 1/00
(Continued)

(56) References Cited

U.S. PATENT DOCUMENTS

| 6,697,436 B1 | 2/2004 | Wright et al. | |
|---|---|---|---|
| 7,049,996 B1 * | 5/2006 | Shen | H04N 19/89 341/200 |

(Continued)

OTHER PUBLICATIONS

Quantized precoding for massive MU-MIMO, Jacobson et al., IEEE Communications Letters, pp. 99, Oct. 24, 2016.
(Continued)

*Primary Examiner* — Khai M Nguyen
(74) *Attorney, Agent, or Firm* — Clark Hill PLC; James R. Foley

(57) ABSTRACT

A method for increasing the effective resolution of digital-to-analog conversion for the purpose of digital pre-distortion to compensate distortions of a communication channel, according to which a digital sequence of N samples x(n) to be transmitted over the communication channel are received and several quantization possibilities are generated by performing Soft Quantization (SQ) on each sample, using a soft quantizer, where low computational complexity is maintained by limiting the number of SQ possibilities. The Instantaneous costs for each possible SQ error is computed and converging paths in the Trellis diagram, which represents possible states and transitions between them, for each sample is eliminated. Then the averaged errors for each remaining path are computed and Hard-Quantization is performed to eliminate converging paths and to keep a constant number of states. These steps are repeated N times, (Continued)

one time for each sample and the optimal path with the lowest averaged error selecting. Then the sequence associated with the optimal path is fed into the DAC.

11 Claims, 6 Drawing Sheets

(58) Field of Classification Search
USPC .................................................. 341/143–144
See application file for complete search history.

(56) References Cited

U.S. PATENT DOCUMENTS

| | | | |
|---|---|---|---|
| 9,201,628 B2* | 12/2015 | Azadet | .................. H03F 1/3258 |
| 2012/0025909 A1 | 2/2012 | Jo et al. | |
| 2012/0106676 A1 | 5/2012 | McCallister et al. | |

OTHER PUBLICATIONS

MMSE precoder for massive MIMO using 1-bit quantization, Bin Usman et al., 2016 IEEE International Conf. on Acoustics, Speech and Signal Processing, pp. 3381-3385, Mar. 20-25, 2016.

* cited by examiner

DIGITAL RESOLUTION ENHANCEMENT FOR HIGH SPEED DIGITAL-TO-ANALOG CONVERTERS

This application is a National Phase Filing of PCT/IL2018/051164, having an International filing date of Nov. 1, 2018, which claims priority of U.S. Provisional Application No. 62/580,475, having a filing date of Nov. 2, 2017. The disclosure of the foregoing are hereby incorporated by reference.

FIELD OF THE INVENTION

The present invention relates to the field of high-speed communication systems. More particularly, the invention relates to a method and system that improve the effective resolution of Digital-to Analog conversion devices (DACs).

BACKGROUND OF THE INVENTION

Digital Pre-Compensation (DPC) is considered a promising technique for high throughput communication systems. The digital signal processing (DSP) at the transmitter relies on the availability of high-speed and high-resolution digital-to-analog devices to generate complex analog waveforms. However, one major challenge in conventional DACs technology is the limited resolution, which introduces dominant quantization distortions when extensive Digital Signal Processing (DSP) is implemented. This issue is especially severe in high-speed optical links, such as Data-Centers Interconnections (DCI—networking of two or more different data centers to enable them to work together, share resources and/or pass workloads between one another). However it also possess a major challenge in other high speed communication systems, such as copper communication (cable modem), wireless communication (WiFi, Long-Term Evolution (LTE—a standard for high-speed wireless communication for mobile devices and data terminals), Wireless Gigabit Alliance (WiGig—a trade association that developed multi-gigabit per second speed wireless communications), 5G-fifth generation of cellular mobile communications, etc.) and others.

As data rate requirement of optical networks continues to increase exponentially [1], future generations of optical systems are expected to fully maximize the capacity of the Physical Layer (PHY) infrastructure. One way to obtain a substantial capacity growth is to use higher-order spectrally efficient modulation formats, such as QAM-64, QAM-128 and beyond. However, these High-Order-Modulations (HOMs) are known to have challenging signal-to-noise (SNR) requirements, which make them highly susceptible to channel impairments.

One major limiting factor for the required transmission rates is the narrow bandwidth of the electrical and optoelectronic devices, which in current technology is limited to sub-Nyquist. As a result, extensive Inter-Symbol Interference (ISI) is introduced, which degrades the Bit Error Rate (BER) performance.

To overcome this severe bandwidth limitation, Digital Pre Compensation (DPC) has been proposed [2]-[12], where it was shown that pre-compensation at the transmitter is necessary to reduce the penalty induced by the bandwidth limited components, in order to achieve extended reaches and higher transmission rates. In addition, DPC provides better tolerance to channel non-linearity [6]. Also, pre-compensation can also be used to enhance the resolution of the Analog-to Digital Converters (ADCs) at the receiver, and to reduce the DSP complexity [13]. Consequently, the link capacity can be substantially increased.

On the other hand, effective implementation of DPC raises new challenges. As the symbol rate and modulation order increase, DPC is required to enhance higher frequencies at higher gains, which leads to a significantly larger dynamic range of transmitted signal waveforms. This, in turn, pronounces the impact of digital-to-analog-converters (DACs) quantization distortions, as they are traditionally constrained by the well-known additive noise model [14]-[16]. Since in this case the Signal-to Quantization-Noise (SQNR) is proportional to the dynamic range, an inherent trade-off exists between the ability to pre-compensate the signal and the DACs resolution [14]-[16]. Therefore, for effective pre-compensation, a large number of bits is usually required, which leads to excessive power consumption, high costs and large silicon space requirement.

Conventional coherent systems typically employ 8 bits DACs and ADCs, which consume up to 40% of the total power of the DSP block [17]. Therefore, low-resolution pre-compensation is an essential requirement for next generation high-speed applications, such as short-reach Data-centers Interconnects (DCI).

It is therefore an object of the invention to provide a method and system for performing digital low-resolution pre-compensation of quantization distortions of a communication channel.

It is another object of the invention to provide a method and system for performing digital low-resolution pre-compensation of quantization distortions, which increases the communication channel capacity, using the same DACs hardware, either by increasing the order of the modulation formats and spectral efficiency (SE) or by increasing the symbol rate.

It is a further object of the invention to provide a method and system for performing digital low-resolution pre-compensation of quantization distortions, which reduces the complexity, power consumption and cost of the transmitter.

Other objects and advantages of this invention will become apparent as the description proceeds.

SUMMARY OF THE INVENTION

A method for increasing the effective resolution of digital-to-analog conversion for the purpose of digital pre-distortion to compensate distortions of a communication channel, according to which a digital sequence of N samples x(n) to be transmitted over the communication channel are received and several quantization possibilities are generated by performing Soft Quantization (SQ) on each sample, using a soft quantizer, where low computational complexity is maintained by limiting the number of SQ possibilities. The Instantaneous costs for each possible SQ error is computed and converging paths in the Trellis diagram, which represents possible states and transitions between them, for each sample is eliminated using for example, the Viterbi algorithm or MLSE. Then the averaged errors for each remaining path are computed and Hard-Quantization is performed to eliminate converging paths and to keep a constant number of states. These steps are repeated N times, one time for each sample and the optimal path with the lowest averaged error selecting. Then the sequence associated with the optimal path is fed into the DAC.

The complexity may be reduced by using channel shortening filters that reduce the number of channel taps. The quantization noise may be shaped to be inversely related to the channel response and centered at the far ends of the spectrum.

The communication channel may be an optical communication channel or another channel, such as:
- an ADSL communication channel;
- a wireless communication channel;
- a cellular communication channel;
- a WiFi channel.

Feeding the sequence associated with the optimal path into the DAC reduces the quantization noise associated with the DAC, at the output of the communication channel. Also, feeding the sequence associated with the optimal path into a DAC with lower resolution maintains the quantization noise at the output of the communication channel.

Apparatus for compensating communication channel distortions by dynamic pre-distortion of Digital-to Analog conversion performed by a DAC before transmission over the communication channel, which comprises:
a) a DSP circuit, adapted to generate a digital sequence of N samples x(n) to be transmitted over the communication channel;
b) a soft quantizer for generating several quantization possibilities by performing Soft Quantization (SQ) on each sample, the DSP circuit is further adapted to:
maintain low computational complexity by limiting the number of SQ possibilities; compute the instantaneous costs for each possible SQ error;
eliminate converging paths in the Trellis diagram, which represents possible states and transitions between them for each sample;
compute the averaged errors for each remaining path;
eliminate converging paths, to keep a constant number of states;
repeat the preceding steps N times, one time for each sample;
select the optimal path having the lowest averaged error; and
feed the sequence associated with the optimal path into the DAC.

DETAILED DESCRIPTION OF THE INVENTION

The present invention proposes a Dynamic Quantization (DQ) method using a Digital-Resolution-Enhancer (DRE), which mitigates the quantization distortion effects of prior art methods. This method is mostly directed to digital pre-compensation, and is based on the assumption that quantization is a non-linear deterministic operation (rather than the conventionally assumed white noise), implying that its impact on transmission can be anticipated and minimized. The proposed DRE improves the signal-to-quantization-noise-ratio (SQNR) by up to 8 dB. Thus, the DPC can be applied with reduced number of DAC's bits. Conversely, the DRE can enable the use of more complex DPC and more complex transmission (with higher QAM orders) schemes using the same DACs hardware, and consequently achieve extended reaches and higher transmission rates.

Figure 1:
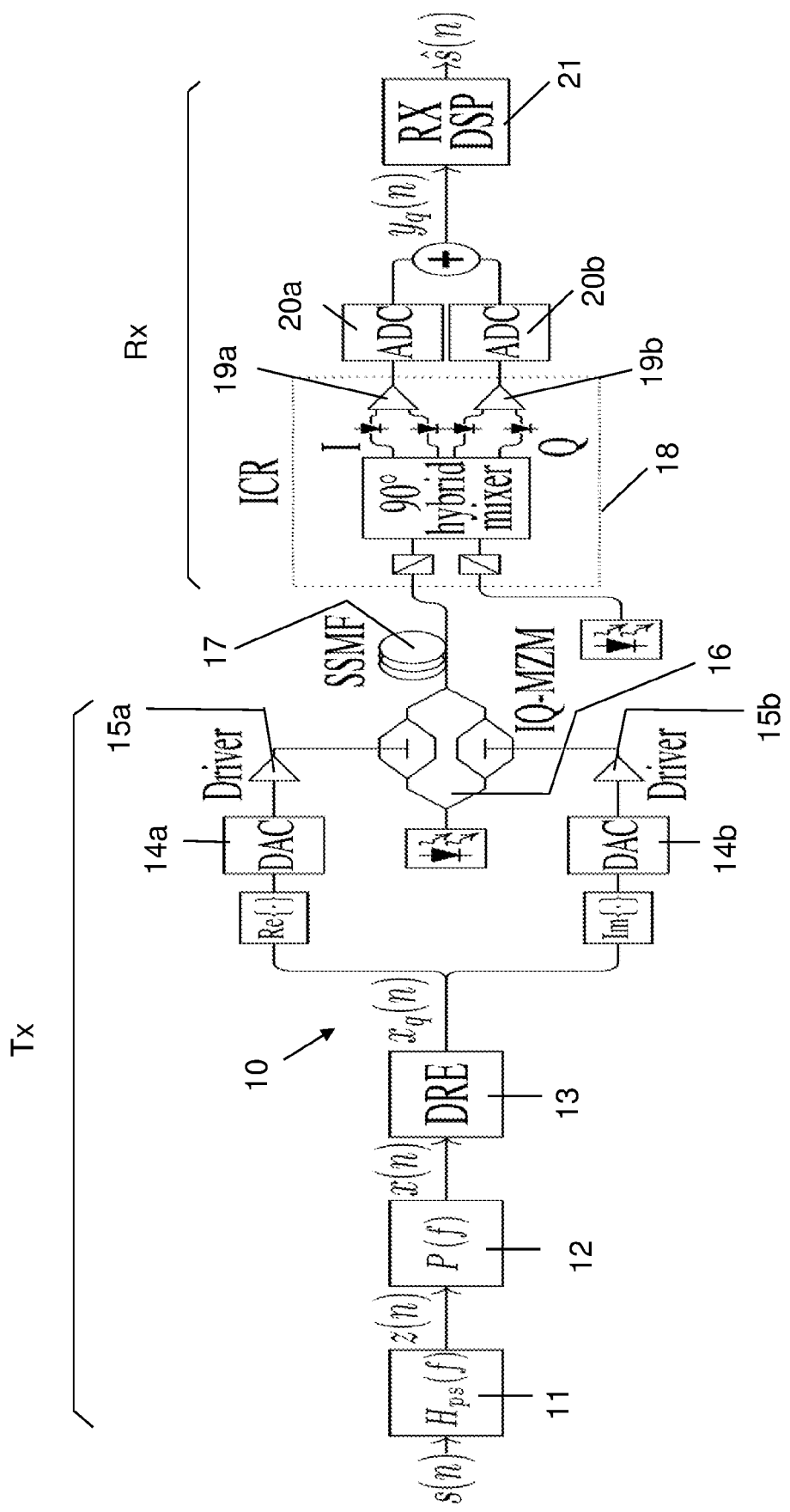
FIG. 1 is a block diagram of a system for performing digital low-resolution pre-compensation of quantization distortions of an optical communication channel coherent transmission system with digital resolution enhancer block, according to an embodiment of the invention.

FIG. 1 is a block diagram of a system 10 for performing digital low-resolution pre-compensation of quantization distortions of an optical communication channel coherent transmission system with digital resolution enhancer block, according to an embodiment of the invention. The DSP of the transmitter Tx consists of a Root Raised Cosine (RRC) pulse shaping filter Hps (f) 11, with frequency response $$H_{ps}(f) = \begin{cases} 1, & |f| \leq \frac{1-\beta}{2T_s} \\ \frac{1}{\sqrt{2}}\sqrt{1+\cos\left(\frac{\pi T_s}{\beta}\left(|f|-\frac{1-\beta}{2T_s}\right)\right)}, & \frac{1-\beta}{2T_s} \geq |f| \leq \frac{1+\beta}{2T_s} \\ 0, & |f| \geq \frac{1+\beta}{2T_s} \end{cases} \quad (1)$$

where β is the filter roll-off factor (steepness of its transmission function with frequency) and Ts is the symbol duration. By denoting the information bearing signal (symbols sequence) as s(n), the pulsed shaped signal can be written as z(n)=s(n)*hps(n), where hps(n) is the sampled RRC filter and * is the convolution operator. A DPC filter P(f) 12 is applied on z(n) to mitigate the channel low-pass response, resulting in the pre-compensated signal x(n). The general assumption is that the channel response Hc(f) is known at the transmitter and is used to optimize the DPC filter 12. ˆs(n) is the estimated symbol sequence.

The DPC frequency response, which was derived in [8] and has been used for the proof-of-concept, is given by $$P(f) = \frac{|H_{ps}(f)|^2 H_c(f)^*}{|H_{ps}(f)|^2 |H_c(f)|^2 + \xi_0}, \quad (2)$$

where $\xi_0$ is chosen to balance the trade-off between the bandwidth compensation and the amount of quantization errors. The proposed solution incorporates a DRE block 13, which implements the DQ algorithm, to transform the signal x(n) the DRE quantized digital signal Q [x (n)]=$x_q$(n) which is fed to the DACs. The quantization error for each sample is given by q(n)=$x_q$(n)−x(n).

The electrical path includes DACs 14a and 14b, which are modeled as zero order hold interpolators (the quantization is obtained at the DRE 13), followed by a low-pass-filter (not shown), and analog drivers 15a and 15b. The electrical-to-optical conversion is applied using an IQ Mach-Zehnder Modulator (MZM) 16, which feeds the modulated optical signal into a Standard Single-Mode Fiber (SSMF) 17.

At the receiver Rx, the optical input is detected by an Integrated Coherent Receiver (ICR) 18 and amplified by using a linear Trans-Impedance Amplifier (TIA). The electrical signal is then sampled by high resolution ADCs 20a and 20b, and then fed to the receiver DSP block 21, which implements standard coherent algorithms. The ADCs quantization is modeled according to the present invention as additive noise, according to [14]. To evaluate the performance of the DRE 13, a new Figure-Of-Merit (FOM) is proposed, which captures the impact of quantization distortion at the receiver-side, while incorporating the channel response. A Matched Filter (MF) Mean-Squared-Quantization Error (MSQE) criterion is suggested to assess the quantization contribution to the Matched Filter Mean-Squared-Error (MF-MSE):

$$\text{MF-MSQE} = E[|(y_q(n)-y(n))*h_{ps}(n)|^2], \quad (3)$$

where y(n) represents the discrete time samples at the channel output, without DACs quantization, and $y_q(n)$ represents the discrete time samples at the channel output, with DACs quantization (i.e., the received signal with digital-to-analog conversions).

Low Resolution DPC Based on Dynamic Quantization

Typically, DACs quantization is obtained as a round-off between each digital sample and its nearest analog value. Under certain conditions, the resulting error can be modeled as uniformly distributed white noise [14] [16]. However, modeling quantization error as noise completely disregards the fact that quantization is inherently a non-linear deterministic function. As the effect of quantization can be directly calculated, its impact on the system performance can be analytically derived and minimized.

The present invention proposes a novel algorithm, which optimizes the quantization decisions, based on the MF-MSQE criterion defined in Eq. 3. It is assumed that the channel generates correlation between successive quantization errors and therefore, the optimal error sequence is not necessarily white. Instead, the optimal error sequence should be inversely matched to channel, through which it is transmitted. Specifically, in the case of transmission over bandwidth limited channels, better performance can be achieved when the low frequency components of the quantization noise are suppressed on the expense of the enhancement of the high out-off-band frequencies. This noise spectral shaping leads to significant improvement, as the errors are naturally suppressed by the channel low-pass response.

Mathematically, the MF-MSQE is evaluated using the effective quantization error, obtained as the resultant error after applying MF at the receiver:

$$q_{eff}(n) = q(n)*h(n), \quad (4)$$

where h(n) is the combined Channel Impulse Response (CIR) of the channel hc(n), and the pulse shape filter hps(n), i.e. $h(n)=hc(n)*hps(n)$. It is assumed that h(n) is finite impulse-response (FIR) filter, with L significant taps. Using these notations, the instantaneous cost of each quantization decision (i.e., of possible SQ error) can be written as $$J(n) = |q_{eff}(n)|^2 = \left|\sum_{l=0}^{L-1} h(l)q(n-l)\right|^2, \quad (5)$$

which can be directly related to the MF-MSQE from Eq. 3 via $$\text{MF-MSQE} = E[J(n)]. \quad (6)$$

From equations 5-6, it is concluded that quantization decisions should not be viewed independently, as their actual impact on the MF-MSQE is also affected by previous decisions, and each decision impacts both current and future costs.

Dynamic Quantization

Eq. 6 shows the problem of dynamic quantizer design, where each quantization decision has a direct instantaneous cost and the performance is measured over its expectation (the expected value of a random variable). The objective is to balance the trade-off between the instantaneous cost of each decision and its impact on future costs, acknowledging the probability that greedy decisions may be destructive for the averaged cost, which is equivalent to the MF-MSQE. Optimization is performed by allowing the quantizer to make structured decisions, which are not necessarily constrained by trivial decisions. The conventional round-off error is replaced by the DQ error $$q_{dq}(n) = q_{ro}(n) + u(n)\cdot\Delta, \quad (7)$$

which is a sum of the round-off error $q_{ro}(n)$, and a control parameter u(n). $\Delta$ describes the quantizer step size (i.e. the analog distance between two neighboring output levels). To ensure finite and discrete outputs, u(n) must satisfy $$u(n)\in\mathbb{Z} \text{ and } c_{min} \leq q_{ro}(n)+u(n)\cdot\Delta \leq c_{max} \quad (8)$$

where $c_{min}$ and $c_{max}$ are the quantizer minimal and maximal values, respectively. Referring to the DQ problem, it is desired to find the optimal control sequence $u_{opt}=(u_{opt}(0), u_{opt}(1), \ldots u_{opt}(N-1))$ for arbitrary sequence length N (i.e., a digital sequence of N samples x(n)), such that the Mean-Squared Quantization Error (MSQE) described in Eq. 6 is minimized. Generally, the DAC should have sufficient separate levels, in order not to degrade performance due to quantization noise.

Figure 2:
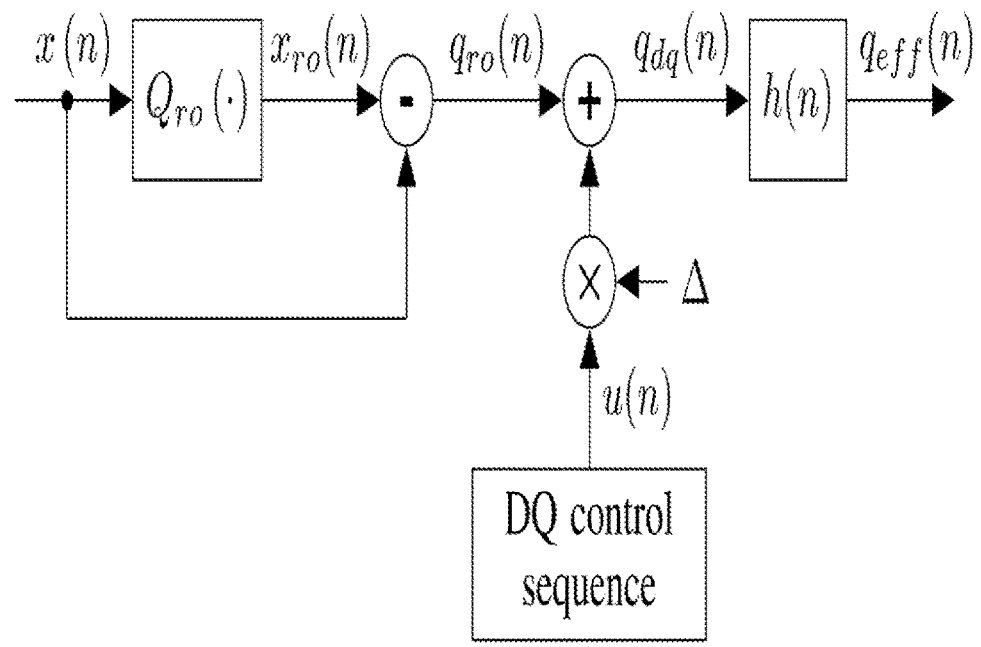
FIG. 2 is a schematic diagram illustrating the DQ problem.

FIG. 2 is a schematic diagram illustrating the DQ problem. This separation into round-off errors and control sequence exploits the important round-off quantization property of decorrelation between the quantization errors and the input samples [14]. Since the errors and the signals are un-correlated, the optimal control sequence can be estimated solely based on the observation of the sequence $q_{ro}(n)$. This problem is equivalent to states estimation in Hidden-Markov-models (HMMs), for which the states in this case can be the last L−1 controls (L is the number of channel taps). Furthermore, the round-off operator generates un-correlated white spectrum error sequences, which essentially lead to independent transition probabilities in the HMM.

Figure 3:
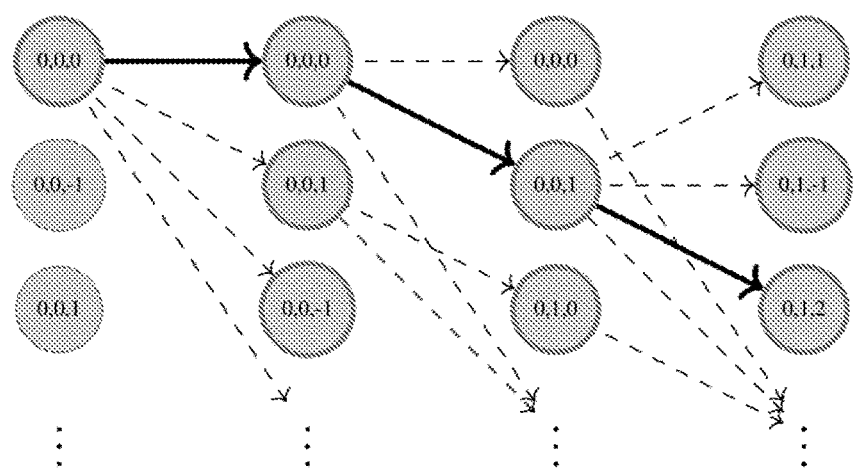
FIG. 3 illustrates the DQ problem using trellis diagram, for memory length L=4 and assuming that the optimal state, until time index n=k, is known.

This decorrelation property significantly simplifies the solution to the DQ problem. Since the round-off quantization error is essentially independent on the inputs, generic solution can be derived. Once the problem is well formulated, optimal solution can be obtained by applying DP algorithms [19] that are based on converging paths, such as the Viterbi algorithm. FIG. 3 illustrates the DQ problem using Trellis diagram (which represents possible states and transitions between them), for memory length L=4 and assuming that the optimal state, until time index n=k, is known. The number within the circles represents the last L−1 values of u(n). The solid lines are the optimal paths between the state that minimizes the MSE, and the dashed lines the optional paths between the states, which correspond to the number of possible u(n) values that appear in Eq. 8. The number of paths grows exponentially with the number of samples. The vertical dots address all additional states that do not appear in circles.

Digital Resolution Enhancer

The digital resolution enhancer (DRE) block 13 solves the DQ problem efficiently by implementing a block-wise low-complexity Viterbi algorithm.

Figure 4:
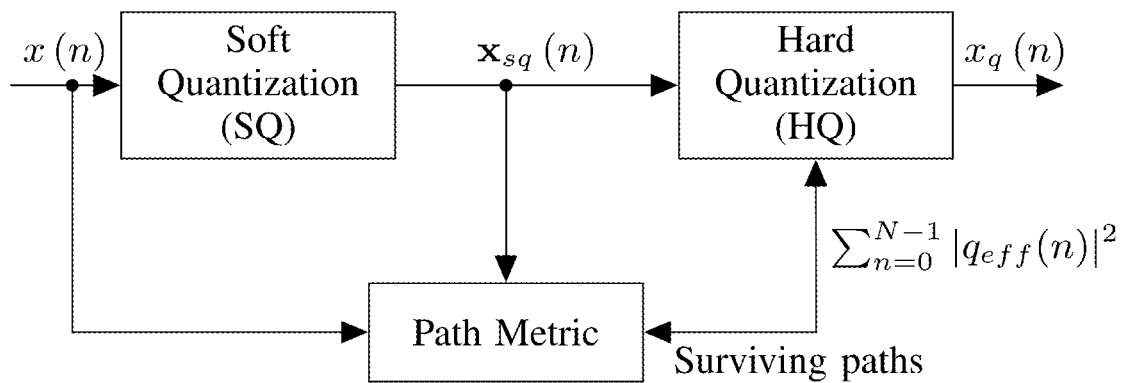
FIG. 4 is a block diagram of the DRE, according to an embodiment of the invention.

FIG. 4 is a block diagram of the DRE 13 which consists of three main building blocks. First, Soft Quantization (SQ) is applied on each sample of the digital input by a soft quantizer, which generates several quantization possibilities, according to equations 7-8.

To maintain low computational complexity, one can limit the number of SQ possibilities by constraining u(n) to a smaller subset than the one described in Eq. 8. Selecting a limited number of options, such as $u(n) \in \{-1, 0, 1\}$, results in a significant improvement. As a second step, path metric block computes the instantaneous costs J(n) for each possible sample, and the averaged errors for each of the surviving Viterbi paths. The optimal path with the lowest averaged error is selected, and the sequence associated with this optimal path is fed into the DAC.

At the Hard-Quantization (HQ) block, converging paths are eliminated to keep a constant number of states, so as to enable feasible hardware implementation. The complexity of the algorithm can be estimated similarly to other method that are based on Viterbi algorithm such as maximum-likelihood sequence-estimation (MLSE) [18], [22], [23]. The required number of calculation is approximated as $M^L \cdot N$, where M is the number of SQ possibilities (M=3 was considered in this example), L is the number of channel taps and N is the length of the sequence. The complexity can be significantly reduced by using channel shortening filters, that reduces the number of channel taps [23], [24], or by reducing the number of states [25]. In addition the algorithm can be applied on truncated sequences for reduced latency, where using $N \geq 5 \cdot L$ is expected to yield near-optimal performance [22].

For example, if the channel memory is memory length L=3, after receiving 3 samples there are $3^3 = 27$ possibilities, which are 27 paths in the Trellis diagram. After receiving the 4 sample, the number of possibilities increases to be $3^4 = 81$ possibilities, so the number of required average error calculations will be 81. This number is reduced back to 27 by hard quantization, by eliminating converging paths in the Trellis diagram. These calculations and elimination are repeated N times (as the size of the input sequence) until only one path is left, which is the optimal path.

An inclusive set of Monte-Carlo simulations were carried out to evaluate the performance of the proposed method. The model is based on typical coherent systems. FIG. 1 illustrates a schematic block diagram of coherent transmission system with digital resolution enhancer block.

The main channel impairment considered here was the limited bandwidth of the electrical and opto-electric components, which was modeled as a 3rd order Bessel Low-Pass-Filter (LPF) with −3 dB attenuation at 16 GHz. The transmitter consisted of an RRC filter with roll-off factor $\beta=0.2$, followed by a DPC filter, as described in Eq. 2. The performance of the algorithm was measured by comparing the SNR at the receiver, after linear equalization with and without the DRE block, i.e. by comparing the DRE with the conventional round-off quantizer. The post-equalization is performed to mitigate the residual ISI, and optimize the SNR performance. Thus, the effect of DACs quantization could be measured accurately.

Spectral Response of the DRE Quantization Noise

Figure 5:
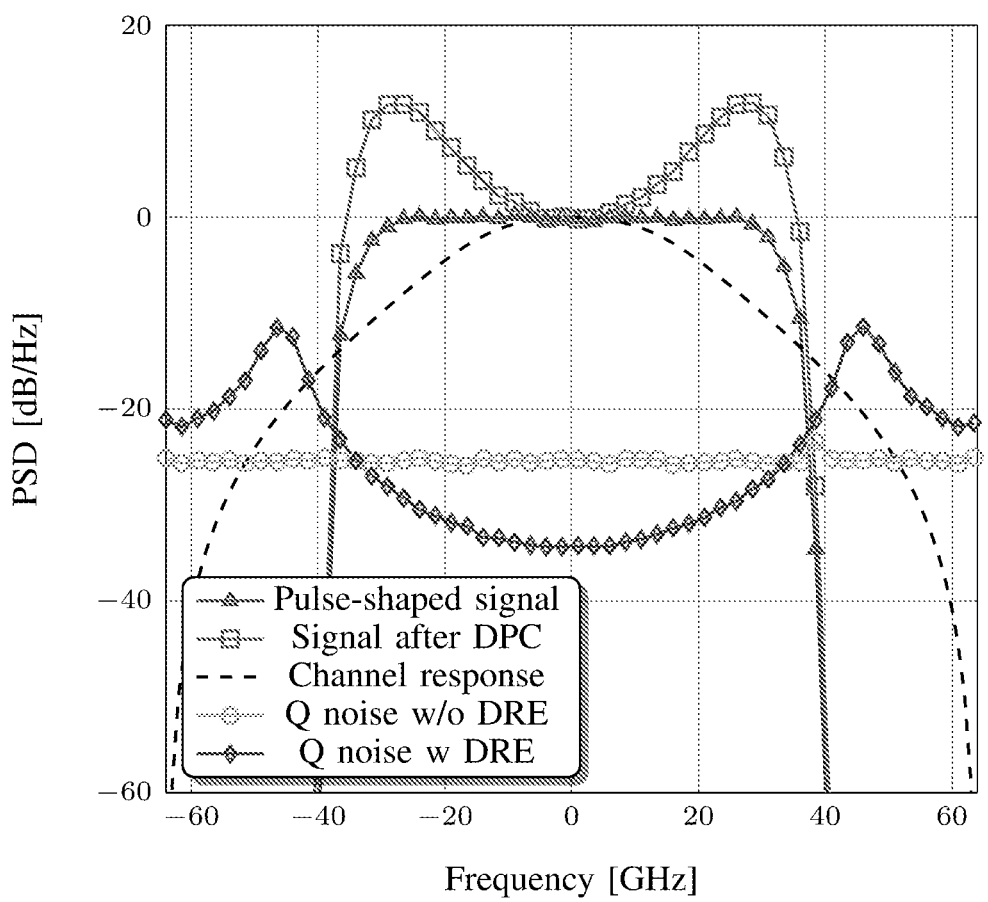
FIG. 5 shows the Power-Spectral-Density (PSD) of the pulse-shaped signal, the pre-compensated signal, the channel response and the quantization noises, with and without the DRE for 4 bits DACs.

FIG. 5 shows the Power-Spectral-Density (PSD) of the pulse-shaped signal, the pre-compensated signal, the channel response and the quantization noises, with and without the DRE for 4 bits DACs. The simulation was performed for 64 Gbaud QAM-64 transmission; The DAC was assumed to operate with 2 Samples-Per-Symbol (SPS). FIG. 5 shows that the DRE shapes the quantization noise inversely to the channel response, as opposed to the conventional quantizer, which results in white spectrum noise. Although the overall power of the noise has been enhanced with the DRE, the noise was centered at the far end of the spectrum at the expense of the lower in-band frequencies. The out-of-band noises are attenuated at the transmitter, by the components low-pass response. Thus, the effect on the neighboring channels in Wavelength-Division-Multiplexing (WDM) systems is suppressed. In addition, the nonwhite spectral response of the noise should be incorporated in the DPC optimization, and may affect the results presented in Eq. 2. However, the spectral response of the noise may be difficult to obtain analytically. In this example, the parameter $\xi_0$ has been optimized using Monte-Carlo simulations.

SNR Results

Figure 6:
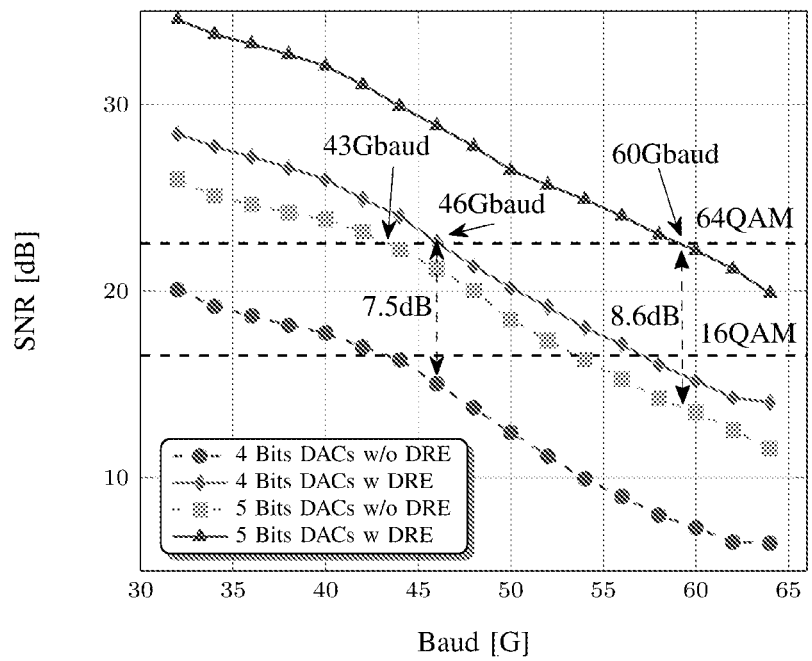
FIG. 6 shows the SNR gain, achieved by applying the DRE, for QAM-64 transmission at 2 SPS, with varying symbol rates and 4-5 bit DACs resolution.

FIG. 6 shows the SNR gain, achieved by applying the DRE, for QAM-64 transmission at 2 SPS, with varying symbol rates and 4-5 bit DACs resolution. The SNR was measured after applying 32 taps linear equalizer at the receiver. The dotted line is the required SNR for bit-error-rate of 1e-3, which is typically considered a threshold for implementing forward-error-correction (FEC). Referring to the 4 bit quantization, ~8 dB SNR gap can be seen between the conventional quantization and DRE based quantization. This improvement can be leveraged to achieve the required SNR for BER of 1e-3, at more than 45 Gbaud, and data rate of up to 540 Gb/sec (with DP), as opposed to the standard quantization which limits the transmission rate to less than 32 Gbaud. For the 5 bits cases, similar SNR gain, ~8 dB, was achieved. This can be used to extend the transmission rate by over 16 Gbaud, i.e., from 43 Gbaud to 60 Gbaud, and providetotal data rate of 720 Gb/s.

Since the method proposed by present invention reduces the quantization noise, it improves performance. Therefore, is possible to work with DACs with lower resolution and get performance like working with DACs with higher resolution (for example, by using the proposed method, a DAC with 6 bit resolution may provide performance like a DAC with 8 bit resolution)

Experimental Results

Electrical Back-to-Back (BTB) Transmission

The foregoing results were verified in electrical BTB transmission. 45 Gbaud QAM-64 signal was obtained using 64 Gsamp/sec DACs and ADCs [26]. RRC filter with roll-off factor of $\beta=0.15$ and pre-compensation filter were implemented at the transmitter. A 64 taps linear equalizer has been incorporated in the receiver.

Figure 7:
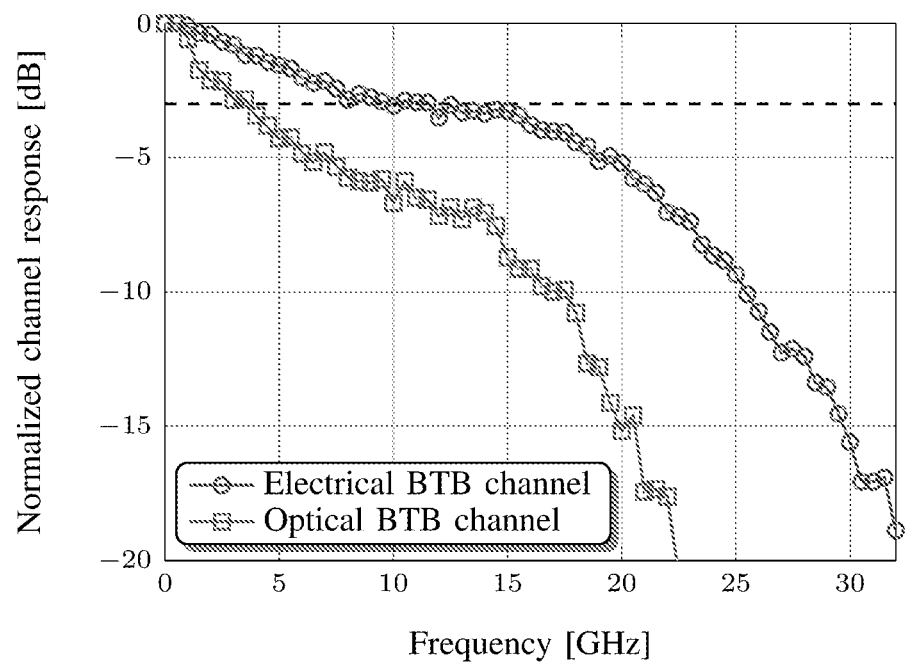
FIG. 7 shows the measured BTB electrical channel response with −3 dB level at ~13 GHz.

FIG. 7 shows the measured BTB electrical channel response with −3 dB level at ~13 GHz. The experiment was performed for 4 bits quantization, which usually introduces dominant SQNR penalty without DRE, as demonstrated in FIG. 6. The low resolution quantization was obtained by using only 4 out of the 8 nominal bits of the DACs (16 analog levels).

Figure 8A:
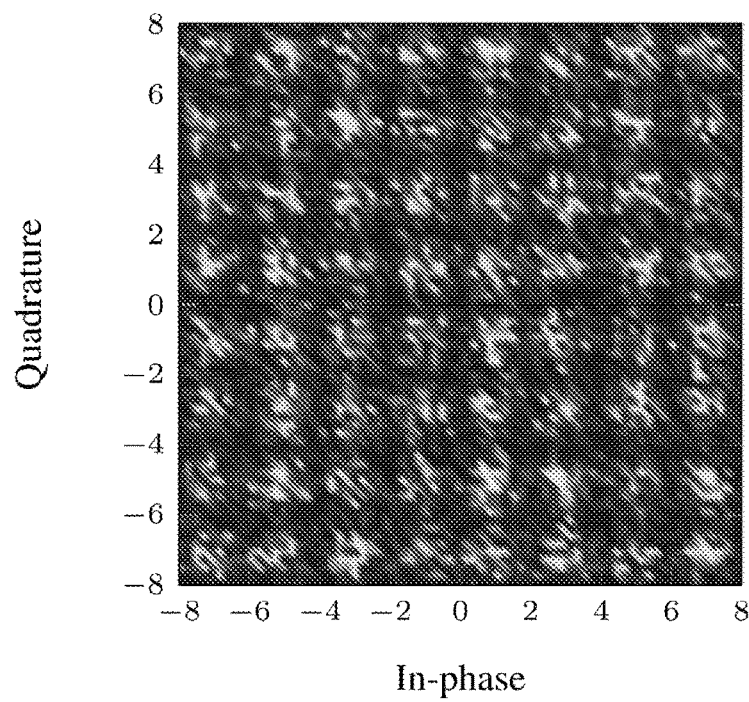
FIGS. 8A and 8B show the measured constellations, with and without the DRE.
Figure 8B:
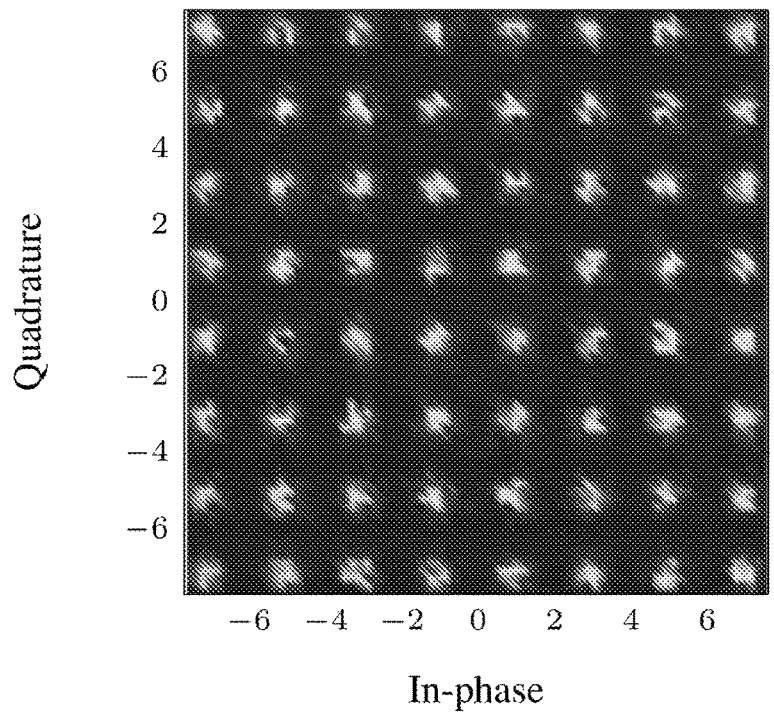

FIGS. 8A and 8B show the measured constellations, with and without the DRE. Without DRE, SNR of 17.3 dB was obtained with BER results of 5.1e-2. The DRE substantially improved the performance of the SNR to 22.7 dB, i.e., more than 5 dB improvement, and BER of 7.1e-4, which is below the required pre-FEC value.

Figure 9A:
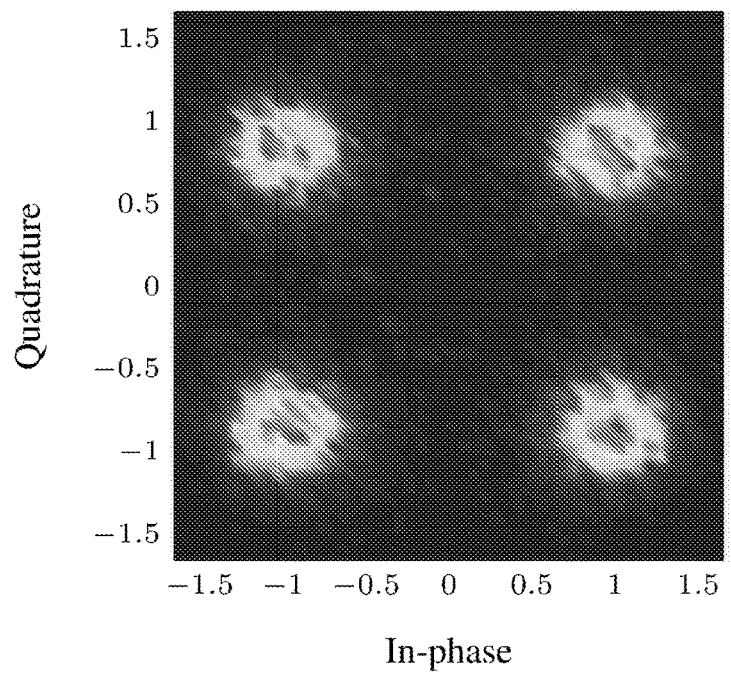
FIGS. 9A and 9B show the measured constellations for optical BTB setup for QPSK with and without the DRE.
Figure 9B:
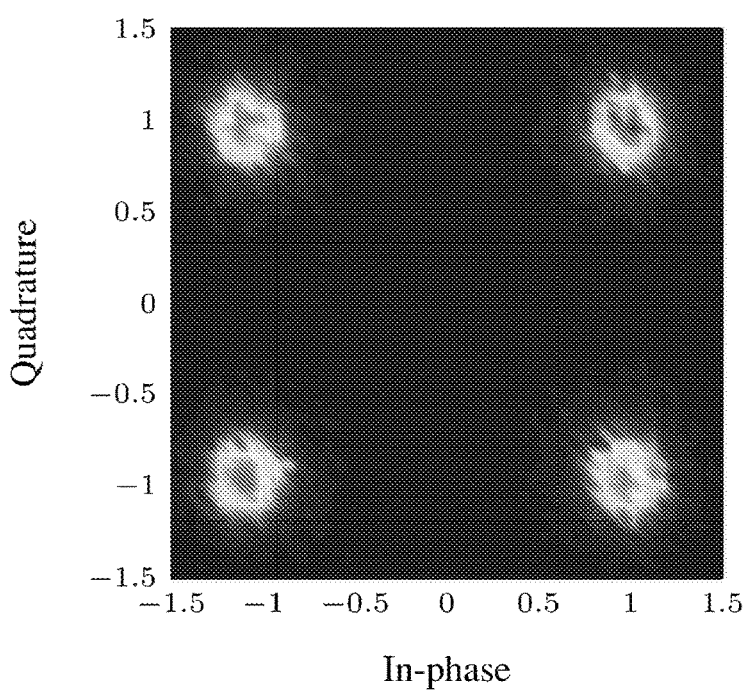

FIGS. 9A and 9B show the measured constellations for optical BTB setup for QPSK with and without the DRE.

Optical Back-to-Back Transmission

The optical BTB setup is as described in FIG. 1 and its parameters are as shown in Table 1 below.

TABLE 1

| Component | Parameter | Value |
|---|---|---|
| TX DSP | Modulation | QPSK |
| | Pulse shape | RRC, β = 0.15 |
| | Pre-emphasis | — |
| DAC | Sample rate | 64 Gsamp/s |
| | Analog bandwidth | 16 GHz |
| | Resolution | 4 out of 8 nominal bits |
| | Memory (N) | $2^{15}$ |
| Driver | Analog bandwidth | 20 GHz |
| | Gain | 30 dB |
| Modulator | Type | Dual-parallel MZM |
| | Analog bandwidth | 25 GHz |
| | Extinction ratio | 15 dB |
| | $V_\pi$ | 7 V (@20 GHz) |
| ECL | Linewidth | 100 KHz |
| | Output power | +15.5 dBm |
| | $\lambda_p$ (public ch.) | 193.200 THz |
| ADC | Sample rate | 64 Gsamp/s |
| | Analog bandwidth | 16 GHz |
| | Resolution | 8 bits |
| | Memory (N) | $2^{17}$ |
| ICR | Analog bandwidth | 22 Ghz |
| | Responsivity | 0.06 A/W |
| | Noise current PSD | 17 pA/(Hz)$^2$ |
| RX DSP | Synchronization | — |
| | CPE and frequency estimation | — |
| | Linear equalizer | 64 taps |
| | Non-linear Volterra equalizer | Memory polynomial non-linearity order 5, memory depth 3 |

The measured optical setup bandwidth is much more aggressive in this case, with −3 dB attenuation at <5 GHz, as shown in FIG. 7. The reason for the lower bandwidth of the optical link in the setup is the concatenating of the driver, modulators, attenuators and integrated coherent receiver. Similarly to the electrical BTB experiment, RRC filter with roll-off factor of β=0.15 and pre-compensation filter were applied at the transmitter. At the receiver, data aided synchronization, Carrier-Phase-Estimation (CPE) and frequency estimation were implemented along with 64 taps linear equalizer and a Volterra non-linear equalizer that has been used to mitigate the non-linearity of the drivers and the MZM. The optical link experiment was carried out for 32 Gbaud quadrature phase-shift-keying (QPSK) modulation. To stress the algorithm ability to reduce the quantization bits, this experiment was performed using only 2.6 DACs bits, which represent 6 analog levels. The measured SNR for the full optical link is 13.3 dB without DRE and 17.6 dB with DRE, i.e., the improvement is more than 4 dB. The BER result measured with the DRE is <1e-6. Constellation diagrams with and without DRE are depicted in FIG. 8. The results presented here indicate that applying DRE enable pulse-shaping and pre-compensation for extremely bandwidth limited infrastructure using very low-resolution DACs components. These results are based on a set of extensive numerical simulations, which demonstrate effective SQNR gain of up to 8 dB. The simulations are verified in electrical and optical lab experiments with a high compatibility between theoretical and experimental results.

The method proposed by the present invention provides a novel dynamic quantization (DQ) approach using DRE, to overcome the DAC resolution limitation. The proposed approach is based on the assumption that quantization is a nonlinear deterministic operation [18].

By using deterministic modeling, the new Figure-Of-Merit (FOM) is made available to evaluate the quantization effect on the system performance. The new FOM incorporates the channel response and is used for inclusive optimizations. This optimization problem is defined as dynamic-quantization (DQ) problem and is formulated within the general framework of dynamic-programming (DP) [19] and (iii) A modified DP Viterbi algorithm of low-complexity has been developed to solve the DQ problem.

As various embodiments have been described and illustrated, it should be understood that variations will be apparent to one skilled in the art without departing from the principles herein. Accordingly, the invention is not to be limited to the specific embodiments described and illustrated in the drawings.

The invention claimed is:

1. A method for increasing the effective resolution of digital-to-analog conversion for the purpose of digital pre-distortion to compensate distortions of a communication channel, comprising:
   a) receiving a digital sequence of N samples x(n) to be transmitted over said communication channel;
   b) generating several quantization possibilities by performing Soft Quantization (SQ) on each sample, using a soft quantizer;
   c) maintaining low computational complexity by limiting the number of SQ possibilities;
   d) computing the instantaneous costs for each possible SQ error by a path metric block;
   e) for each sample, eliminating converging paths in the Trellis diagram, which represents possible states and transitions between them, for each sample;
   f) computing the averaged errors for each remaining path;
   g) performing Hard-Quantization to eliminate converging paths and to keep a constant number of states;
   h) repeating steps b) to g) above N times, one time for each sample;
   i) selecting the optimal path having the lowest averaged error; and
   j) feeding the sequence associated with said optimal path into said DAC.

2. A method according to claim 1, wherein elimination is performed by using a Viterbi algorithm.

3. A method according to claim 1, wherein elimination is performed by using Maximum-Likelihood Sequence-Estimation (MLSE).

4. A method according to claim 1, wherein the complexity is reduced by using channel shortening filters that reduce the number of channel taps.

5. A method according to claim 1, wherein the quantization noise is shaped to be inversely related to the channel response.

6. A method according to claim 1, wherein the quantization noise is centered at the far ends of the spectrum.

7. A method according to claim 1, wherein the communication channel is an optical communication channel.

8. A method according to claim 1, wherein the communication channel is selected from one or more of the following:
   an ADSL communication channel;

a wireless communication channel;

a cellular communication channel;

a WiFi channel.

9. A method according to claim 1, wherein feeding the sequence associated with the optimal path into the DAC reduces the quantization noise associated with said DAC, at the output of the communication channel.

10. A method according to claim 9, wherein feeding the sequence associated with the optimal path into a DAC with lower resolution maintains the quantization noise at the output of the communication channel.

11. Apparatus for compensating communication channel distortions by dynamic pre-distortion of Digital-to Analog conversion performed by a DAC before transmission over said communication channel, comprising:

a) a DSP circuit, adapted to generate a digital sequence of N samples x(n) to be transmitted over said communication channel;

b) a soft quantizer for generating several quantization possibilities by performing Soft Quantization (SQ) on each sample, said DSP circuit is further adapted to:
maintain low computational complexity by limiting the number of SQ possibilities;

compute the instantaneous costs for each possible SQ error by a path metric block in said DSP circuit;

eliminate converging paths in the Trellis diagram, which represents possible states and transitions between them for each sample;

compute the averaged errors for each remaining path;

eliminate converging paths, to keep a constant number of states;

repeat the preceding steps N times, one time for each sample;

select the optimal path having the lowest averaged error; and feed the sequence associated with said optimal path into said DAC.

* * * * *